US012575031B2

(12) United States Patent
Kim et al.

(10) Patent No.: US 12,575,031 B2
(45) Date of Patent: Mar. 10, 2026

(54) CONNECTING BOARD AND MANUFACTURING METHOD OF THE SAME

(71) Applicant: SAMSUNG ELECTRO-MECHANICS CO., LTD., Suwon-si (KR)

(72) Inventors: Gyumook Kim, Suwon-si (KR); Sanghoon Kim, Suwon-si (KR); Young Kuk Ko, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 168 days.

(21) Appl. No.: 18/380,906

(22) Filed: Oct. 17, 2023

(65) Prior Publication Data

US 2024/0298407 A1     Sep. 5, 2024

(30) Foreign Application Priority Data

Mar. 3, 2023     (KR) ........................ 10-2023-0028446

(51) Int. Cl.

| | |
|---|---|
| *G06F 1/16* | (2006.01) |
| *H05K 1/11* | (2006.01) |
| *H05K 1/14* | (2006.01) |
| *H05K 3/30* | (2006.01) |
| *H05K 3/36* | (2006.01) |
| *H05K 5/00* | (2025.01) |
| *H05K 7/00* | (2006.01) |

(52) U.S. Cl.
CPC ............ *H05K 1/145* (2013.01); *H05K 1/112* (2013.01); *H05K 1/117* (2013.01); *H05K 1/144* (2013.01); *H05K 3/301* (2013.01);

*H05K 3/36* (2013.01); *H05K 2201/10689* (2013.01); *H05K 2201/2009* (2013.01); *H05K 2203/304* (2013.01)

(58) Field of Classification Search
CPC .......... H05K 3/36; H05K 3/301; H05K 1/145; H05K 1/112; H05K 1/117; H05K 1/144
See application file for complete search history.

(56) References Cited

U.S. PATENT DOCUMENTS

| | | | |
|---|---|---|---|
| 6,337,510 B1* | 1/2002 | Chun-Jen ............ | H01L 25/0657 |
| | | | 257/E23.047 |
| 6,545,345 B1* | 4/2003 | Glenn .................... | H05K 1/182 |
| | | | 257/676 |
| 7,872,343 B1 | 1/2011 | Berry | |
| 9,281,260 B2* | 3/2016 | Standing ................. | H01L 24/25 |
| 2003/0168719 A1* | 9/2003 | Cheng .................... | H01L 24/97 |
| | | | 257/666 |

(Continued)

FOREIGN PATENT DOCUMENTS

| | | |
|---|---|---|
| KR | 10-2011-0031675 A | 3/2011 |
| KR | 10-2020-0012393 A | 2/2020 |

*Primary Examiner* — Anthony M Haughton
(74) *Attorney, Agent, or Firm* — Morgan, Lewis & Bockius LLP

(57) ABSTRACT

A connecting board according to an embodiment includes a core layer having a cavity in a thickness direction to pass through an inner center region of the core layer based on a plane perpendicular to the thickness direction, a via passing through the core layer, and connection pads that are coupled to both ends of the via. The core layer includes coupling ribs which protrude from an inner surface of the core layer facing the cavity toward the cavity.

18 Claims, 16 Drawing Sheets

(56)           References Cited

U.S. PATENT DOCUMENTS

2009/0038836 A1*   2/2009   Takahashi ............ H05K 3/4691
                                                                29/830
2020/0035632 A1    1/2020   Kim
2025/0081738 A1*   3/2025   Gao ..................... H10K 59/879

* cited by examiner

FIG. 7

CONNECTING BOARD AND MANUFACTURING METHOD OF THE SAME

CROSS-REFERENCE TO RELATED APPLICATION

This application claims priority to and the benefit of Korean Patent Application No. 10-2023-0028446 filed in the Korean Intellectual Property Office on Mar. 3, 2023, the entire contents of which are incorporated herein by reference.

TECHNICAL FIELD

The present disclosure relates generally to a connecting board and a manufacturing method of the same.

BACKGROUND

As the performance of electronic devices has improved with the development of the electronic industry, it has been required to reduce the sizes and thicknesses of semiconductor packages while increasing the densities thereof. As the number of ICs required to be mounted has increased for increasing the densities of packages, the number of I/O connection terminals has increased. For this reason, it is required to secure the process capability for implementing fine circuits with smaller pitches between bonding pads.

In the current methods of mounting ICs in high-density packages, the wiring bonding method and the flip-chip bonding method are used. When the number of I/O connection terminals is beyond a certain level, the flip-chip bonding method is preferred in view of the cost required for mounting. In semiconductor packages, circuit layers which are arranged in the thickness direction are coupled to one another by vias. Accordingly, high-density packages require increasing the number of vias that couple circuit layers, which are arranged in the thickness direction, to one another while securing sufficient spaces for accommodating ICs.

SUMMARY

The present disclosure attempts to provide a connecting board and a manufacturing method of the same capable of making it possible for spaces for accommodating electronic elements to be effectively secured in semiconductor packages.

Further, the present disclosure attempts to provide a connecting board with enhanced strength which is prevented from being deformed or damaged in the course of being stored or handled, and a manufacturing method of the same.

According to an aspect, a connecting board may include a core layer having a cavity in a thickness direction to pass through an inner center region of the core layer based on a plane perpendicular to the thickness direction, a via passing through the core layer, and connection pads that are coupled to both ends of the via, and the core layer may include coupling ribs which protrude from an inner surface of the core layer facing the cavity toward the cavity.

Also, the connecting board may further include a reinforcement dummy that is located in the cavity and is coupled to the coupling ribs.

The reinforcement dummy may include a dummy core layer that is coupled to the coupling ribs, and inner dummy reinforcing members that are attached to at least one of both surfaces of the dummy core layer in the thickness direction.

Alternatively, the reinforcement dummy may include a dummy core layer that is coupled to the coupling ribs, dummy-side solder resist layers that are disposed on both surfaces of the dummy core layer in the thickness direction, and outer dummy reinforcing members that are attached to at least one of both surfaces of the dummy-side solder resist layers in the thickness direction.

Also, the connecting board may further include inner reinforcing members that are attached to at least one of both surfaces of the core layer in the thickness direction.

The connection pads and the inner reinforcing members may include a same material and be spaced apart from each other.

The inner reinforcing members may be spaced apart from the via

Also, the connecting board may further include solder resist layers that are disposed on both surfaces of the core layer in the thickness direction, and outer reinforcing members that are attached to at least one of both surfaces of the solder resist layers in the thickness direction.

Also, the connecting board may further include solder resist layers that are disposed on both surfaces of the core layer in the thickness direction such that inner regions of the solder resist layers facing the cavity get thinner in a direction toward the cavity.

Further in outer surfaces of the connection pads located on an opposite side to regions coupled to the vias, the connection pads may have pad recesses to be concave toward the vias.

Furthermore, the connecting board may include coating layers, disposed on the outer surfaces of the connection pads, covering the pad recesses.

The core layer may include a partition space extending between the coupling ribs.

According to another aspect, a connecting board may include a core layer having a cavity in a thickness direction to pass through an inner center region of the core layer based on a plane perpendicular to the thickness direction, a via passing through the core layer, connection pads that are coupled to both ends of the via, and reinforcing members that are provided on at least one of both surfaces of the core layer in the thickness direction, so as to be coupled to the core layer.

The reinforcing members may include inner reinforcing members that are attached to at least one of both surfaces of the core layer in the thickness direction.

Also, the connecting board may further include solder resist layers that are disposed on both surfaces of the core layer in the thickness direction, and the reinforcing members may include outer reinforcing members that are attached to at least one of both surfaces of the solder resist layers in the thickness direction.

According to yet another aspect, a connecting board manufacturing method may include forming a via in a core member so as to pass through the core member in a thickness direction, and forming connection pads on both ends of the via, sequentially forming solder resist layers and metal thin films on both surfaces of the core member in the thickness direction, forming masks using the metal thin films, and forming a partition space by discontinuously cutting so as to pass between an inner region and an outer region based on a plane perpendicular to the thickness direction so as to define the outer region as the connecting board and the inner region as a reinforcement dummy.

Also, after the masks are formed, outer reinforcing members may be formed on the masks before the connecting board and the reinforcement dummy are defined.

Optionally, the method may further include removing the reinforcement dummy.

According to at least one embodiment among the embodiments, it is possible to provide a connecting board and a manufacturing method of the same capable of making it possible for spaces for accommodating electronic elements to be effectively secured in semiconductor packages.

Also, according to at least one embodiment among the embodiments, it is possible to provide a connecting board with enhanced strength which is prevented from being deformed or damaged in the course of being stored or handled, and a manufacturing method of the same.

BRIEF DESCRIPTION OF THE DRAWINGS

FIG. 7 is a vertical cross-sectional view of a connecting board according to another embodiment.

DETAILED DESCRIPTION

Figure 1:
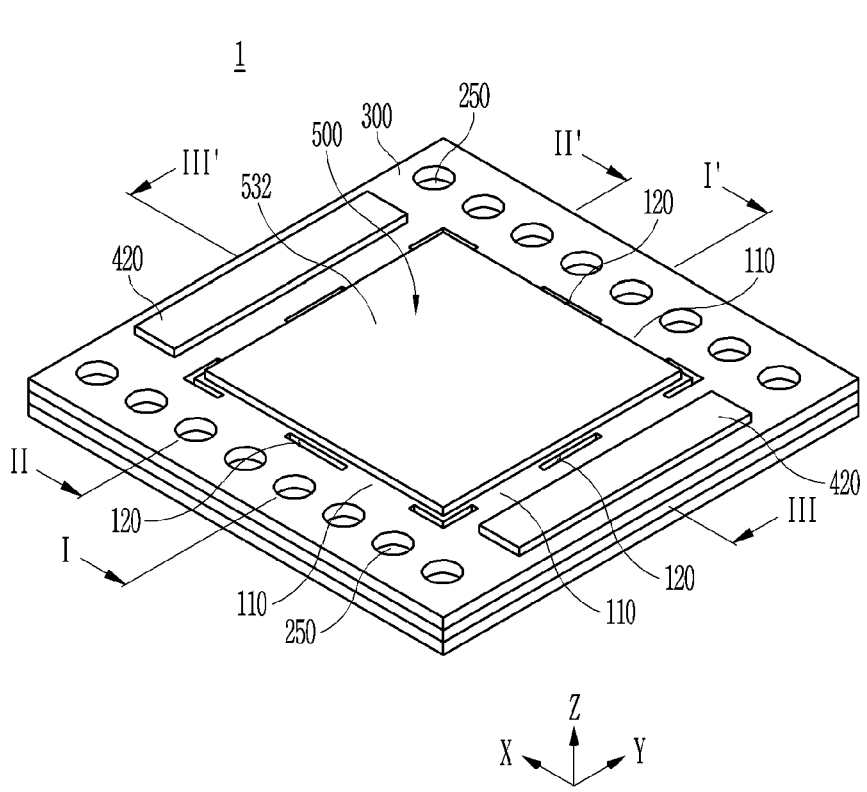
FIG. 1 is a drawing illustrating a connecting board according to an embodiment.

In the following detailed description, only certain embodiments have been shown and described, simply by way of illustration. The drawings and description are to be regarded as illustrative in nature and not restrictive. Like reference numerals designate like elements throughout the specification. Further, some constituent elements in the drawing may be exaggerated, omitted, or schematically illustrated, and a size of each constituent element does not reflect the actual size entirely.

The accompanying drawings are provided for helping to easily understand embodiments disclosed in the present specification, and the technical spirit disclosed in the present specification is not limited by the accompanying drawings, and it will be appreciated that the present invention includes all of the modifications, equivalent matters, and substitutes included in the spirit and the technical scope of the present invention.

Terms including an ordinary number, such as first and second, are used for describing various constituent elements, but the constituent elements are not limited by the terms. The terms are used only to discriminate one constituent element from another constituent element.

Further, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is "on" a reference portion, the element is located above or below the reference portion, and it does not necessarily mean that the element is located "above" or "on" in a direction opposite to gravity.

In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance. Therefore, unless explicitly described to the contrary, the word "comprise", and variations such as "comprises" or "comprising", will be understood to imply the inclusion of stated elements but not the exclusion of any other elements.

Further, in the entire specification, when it is referred to as "on a plane", it means when a target part is viewed from above, and when it is referred to as "on a cross-section", it means when the cross-section obtained by cutting a target part vertically is viewed from the side.

Further, throughout the specification, when it is referred to as "connected", this does not only mean that two or more constituent elements are directly connected, but may mean that two or more constituent elements are indirectly connected through another constituent element, are physically connected, electrically connected, or are integrated even though two or more constituent elements are referred as different names depending on a location and a function.

Throughout this specification, boards have a structure wide in a plan view and thin in a cross-sectional view, and the 'plane direction of a board' may refer to a direction parallel with a wide and flat surface of the board, and the 'thickness direction of a board' may refer to a direction perpendicular to a wide and flat surface of the board.

Hereinafter, a direction in which constituent elements of a connecting board 1 are stacked will be referred to as a thickness direction Z. Further, directions which are orthogonal to each other in a plane perpendicular to the thickness direction Z will be referred to as a length direction X and a width direction Y, respectively.

Figure 2:
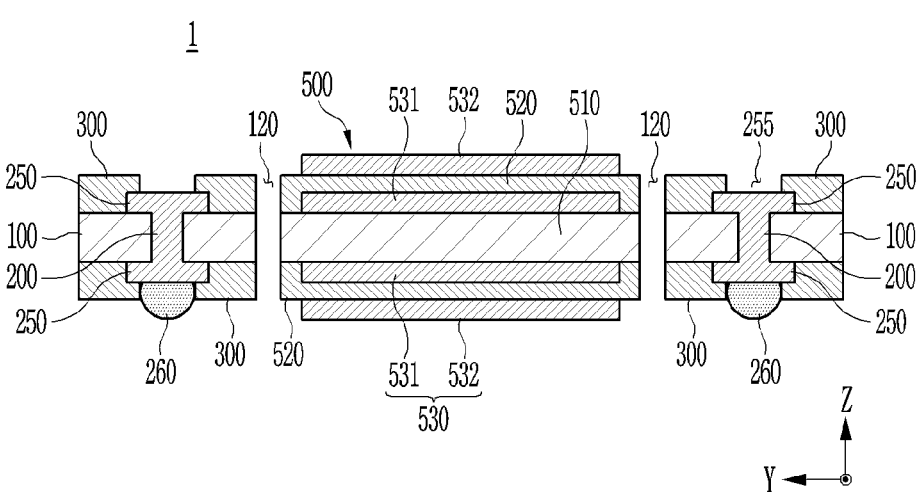
FIG. 2 is a vertical cross-sectional view taken along line I-I' in FIG. 1 extending in the thickness direction.
Figure 3:
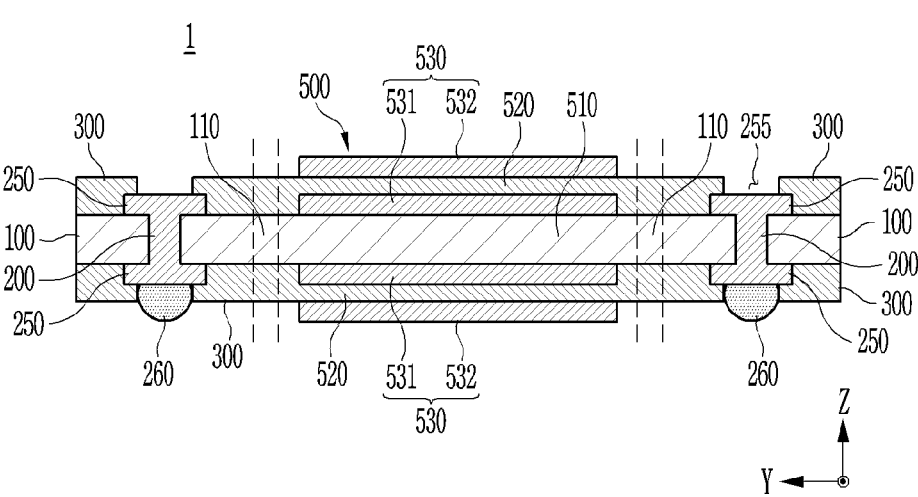
FIG. 3 is a vertical cross-sectional view taken along line II-II' in FIG. 1 extending in the thickness direction.
Figure 4:
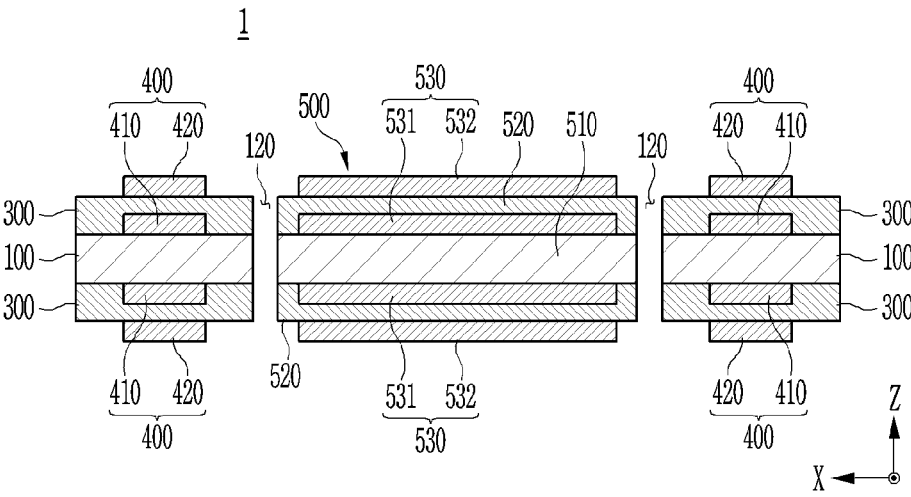
FIG. 4 is a vertical cross-sectional view taken along line III-III' in FIG. 1 extending in the thickness direction.

FIG. 1 is a drawing illustrating a connecting board according to an embodiment, FIG. 2 is a vertical cross-sectional view taken along line I-I' in FIG. 1 extending in the thickness direction, FIG. 3 is a vertical cross-sectional view taken along line II-II' in FIG. 1 extending in the thickness direction, and FIG. 4 is a vertical cross-sectional view taken along line III-III' in FIG. 1 extending in the thickness direction.

Referring to FIG. 1 to FIG. 4, the connecting board 1 according to the embodiment includes a core layer 100, vias 200, and connection pads 250.

The core layer 100 has a predetermined area and a predetermined thickness. The core layer 100 may be formed of an insulating material. For example, the core layer 100 may be formed of a thermosetting resin such as an epoxy resin, a thermoplastic resin such as polyimide, etc. Alternatively, the core layer 100 may be formed of an impregnated reinforcement material, such as impregnated glass fiber or an impregnated inorganic filler, etc. For example, the core layer 100 may be formed of prepreg, Ajinomoto build-up film (ABF), FR-4, a bismaleimide triazine (BT) resin, etc.

The vias 200 are disposed so as to pass through the core layer 100. The vias 200 may be formed of a conductive material. For example, the vias 200 may be formed of one or more of copper (Cu), silver (Ag), palladium (Pd), aluminum (Al), nickel (Ni), titanium (Ti), gold (Au), platinum (Pt), an alloy thereof, etc. In opposite regions with the inner center region of the core layer 100 interposed therebetween based on a plane perpendicular to the thickness direction Z, the vias 200 may be disposed. As an example, the vias 200 may be disposed on both sides of the core layer 100 in the width direction Y.

The connection pads 250 are coupled to the ends of the vias 200 located on both sides of the core layer in the thickness direction. The connection pads 250 may be formed of a conductive material. For example, the connection pads 250 may be formed of one or more of copper (Cu), silver (Ag), palladium (Pd), aluminum (Al), nickel (Ni), titanium (Ti), gold (Au), platinum (Pt), an alloy thereof, etc. The connection pads 250 may be formed of the same material as that of the vias 200.

On the core layer 100, solder resist layers 300 may be formed. The solder resist layers 300 may be formed on both surfaces of the core layer 100 in the thickness direction Z. The solder resist layers 300 may be formed of a thermosetting resin, etc. The solder resist layers 300 may be formed of an impregnated material such as an impregnated silica filler.

The solder resist layers 300 are not formed on at least some parts of regions aligned with the connection pads 250 in the thickness direction, such that openings 255 are formed so as to expose the connection pads 250 to the outside. The solder resist layers 300 may be formed so as to surround the perimeters of the connection pads 250.

The connecting board 1 may include reinforcing members 400. The reinforcing members 400 are disposed on at least one surface of both surfaces of the core layer 100 in the thickness direction, so as to be coupled to the core layer 100. The reinforcing members 400 may include inner reinforcing members 410 and outer reinforcing members 420.

The inner reinforcing members 410 are attached to the core layer 100. The inner reinforcing members 410 may be attached to one surface or both surfaces of the core layer 100 in the thickness direction Z. In opposite regions with the inner center region of the core layer 100 interposed therebetween based on a plane perpendicular to the thickness direction Z, the inner reinforcing members 410 may be disposed. As an example, the inner reinforcing members 410 may be disposed on both sides of the core layer 100 in the length direction X. The inner reinforcing members 410 may be disposed so as to be buried in the solder resist layers 300. The inner reinforcing members 410 may be plate structures having a predetermined area and thickness and having a circular shape, an elliptical shape, a polygonal shape, etc., in a plan view. Also, the inner reinforcing members 410 may have lattice structures in a plan view. The inner reinforcing members 410 may be formed of a metal material such as copper, etc.

The outer reinforcing members 420 are attached to the solder resist layers 300. The outer reinforcing members 420 may be attached to one surface or both surfaces of the solder resist layers 300 in the thickness direction Z. In opposite regions with the inner center region of the core layer 100 interposed therebetween based on a plane perpendicular to the thickness direction Z, the outer reinforcing members 420 may be disposed. As an example, the outer reinforcing members 420 may be disposed on both sides of the core layer 100 in the length direction X. The outer reinforcing members 420 may be plate structures having predetermined area and thickness and having a circular shape, an elliptical shape, a polygonal shape, etc., in a plan view. Also, the outer reinforcing members 420 may have lattice structures in a plan view. The outer reinforcing members 420 may be formed of a metal material such as copper, etc.

Figure 5:
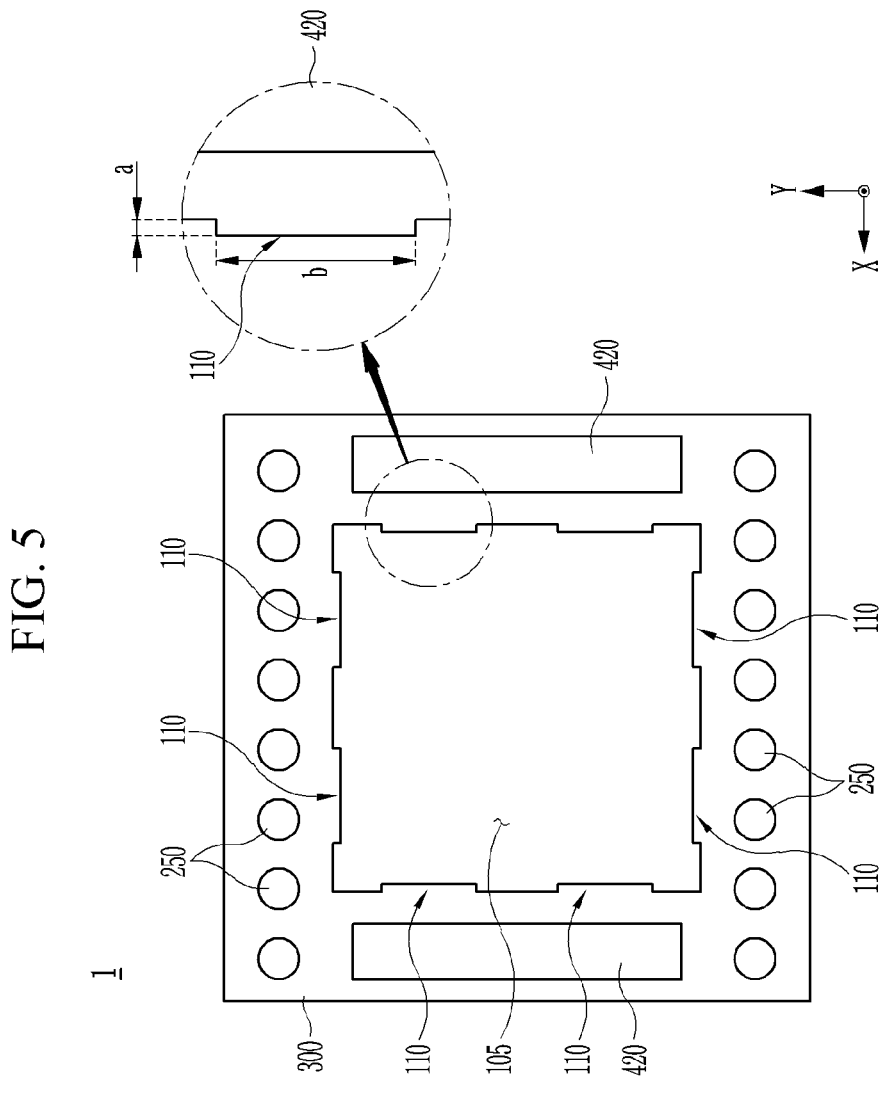
FIG. 5 is a drawing illustrating the connecting board when reinforcement dummy has been removed.

FIG. 5 is a drawing illustrating the connecting board when reinforcement dummy has been removed.

Referring to FIG. 1 to FIG. 5, in the inner center region of the core layer 100 based on a plane perpendicular to the thickness direction Z, a cavity 105 is formed. The cavity 105 is formed so as to pass through the connecting board in the thickness direction Z. The cavity 105 has a size corresponding to an electronic element to be mounted (reference symbol "4" in FIG. 6).

In the cavity 105, reinforcement dummy 500 may be disposed. The inner surface of the cavity 105 and the outer surfaces of the reinforcement dummy 500 face each other with a partition space 120 interposed therebetween.

The reinforcement dummy 500 is coupled to the inner surface of the core layer 100 by coupling ribs 110. The coupling ribs 110 may be formed of the same material as that of the core layer 100, integrally with the core layer 100. The number of coupling ribs 110 which are disposed along the inner surface of the core layer 100 may be one or more. As an example, the coupling ribs 110 may be disposed in regions facing each other with the cavity 105 interposed therebetween.

The reinforcement dummy 500 include dummy core layers 510, dummy-side solder resist layers 520, and dummy reinforcing members 530.

Based on a plane perpendicular to the thickness direction Z, the dummy core layer 510 has an area corresponding to the cavity 105. The dummy core layer 510 may be formed of an insulating material. For example, the dummy core layer 510 may be formed of a thermosetting resin such an as epoxy resin, a thermoplastic resin such as polyimide, etc. Alternatively, the dummy core layer 510 may be formed of an impregnated reinforcement material, such as impregnated glass fiber or an impregnated inorganic filler. For example, the dummy core layer 510 may be formed of prepreg, Ajinomoto build-up film (ABF), FR-4, a bismaleimide triazine (BT) resin, etc. The dummy core layer 510 may be formed of the same material as that of the core layer 100.

The dummy-side solder resist layers 520 may be formed on both surfaces of the dummy core layer 510 in the thickness direction Z. The dummy-side solder resist layers 520 may be formed of a thermosetting resin, etc. The dummy-side solder resist layers 520 may be formed of an impregnated silica filler. The dummy-side solder resist layers 520 may be formed of the same material as that of the solder resist layers 300.

The dummy reinforcing members 530 may include inner dummy reinforcing members 531 and outer dummy reinforcing members 532.

The inner dummy reinforcing members 531 are attached to the dummy core layer 510. The inner dummy reinforcing members 531 may be attached to one surface or both surfaces of the dummy core layer 510 in the thickness direction Z. The inner dummy reinforcing members 531 may be disposed so as to be buried in the dummy-side solder resist layers 520. The inner dummy reinforcing members 531 may be plate structures having predetermined area and thickness and having a circular shape, an elliptical shape, a polygonal shape, etc., in a plan view. Also, the inner dummy reinforcing members 531 may have lattice structures in a plan view. The inner dummy reinforcing members 531 may be formed of a metal material such as copper, etc. The inner dummy reinforcing members 531 may be formed of the same material as that of the inner reinforcing members 410.

The outer dummy reinforcing members 532 are attached to the dummy-side solder resist layers 520. The outer dummy reinforcing members 532 may be attached to one surface or both surfaces of the dummy-side solder resist layers 520 in the thickness direction Z. The outer dummy reinforcing members 532 may be plate structures having predetermined area and thickness and having a circular shape, an elliptical shape, a polygonal shape, etc., in a plan view. Also, the outer dummy reinforcing members 532 may have lattice structures in a plan view. The outer dummy reinforcing members 532 may be formed of a metal material such as copper, etc. The outer dummy reinforcing members 532 may be formed of the same material as that of the outer reinforcing members 420.

The reinforcement dummy 500 may be separated from the connecting board 1 by a cutting process. As an example, the coupling ribs 110 may be cut by a laser, etc., such that the reinforcement dummy 500 is separated from the connecting board 1. After the reinforcement dummy 500 is separated, the coupling ribs 110 are disposed to protrude from the inner surface of the core layer 100 facing the cavity 105 toward the cavity 105. As an example, the protruding length 'a' of the coupling ribs 110 may be 1 μm to 10 μm. Further, the width 'b' of the coupling ribs 110 may be the same as before the cutting process. The width 'b' of the coupling ribs 110 may be 100 μm or larger to prevent the reinforcement dummy 500 from being arbitrarily separated. Further, the coupling ribs 110 may be disposed on straight sections of the inner surface of the core layer 100, and the width 'b' of the coupling ribs 110 may be shorter than the length of the straight sections.

In the connecting board 1 according to the embodiment, the reinforcement dummy 500 is disposed in the cavity 105. The reinforcement dummy 500 is coupled to the core layer 100 so as to reinforce the strength of the core layer 100. Accordingly, the connecting board 1 is prevented from being deformed or damaged in the course of being stored or handled. After the reinforcement dummy 500 is separated from the connecting board 1, the connecting board 1 is used in packaging.

Also, in the connecting board 1 according to the embodiment, the dummy reinforcing members 530 are disposed in the reinforcement dummy 500. The dummy reinforcing members 530 improve the strength of the reinforcement dummy 500, whereby the connecting board 1 is more surely prevented from being deformed or damaged in the course of being stored or handled.

Further, the reinforcing members 400 of the connecting board 1 according to the embodiment reinforce the strength of the connecting board 1. Accordingly, the connecting board 1 is prevented from being deformed or damaged in the course of being stored or handled.

Figure 6:
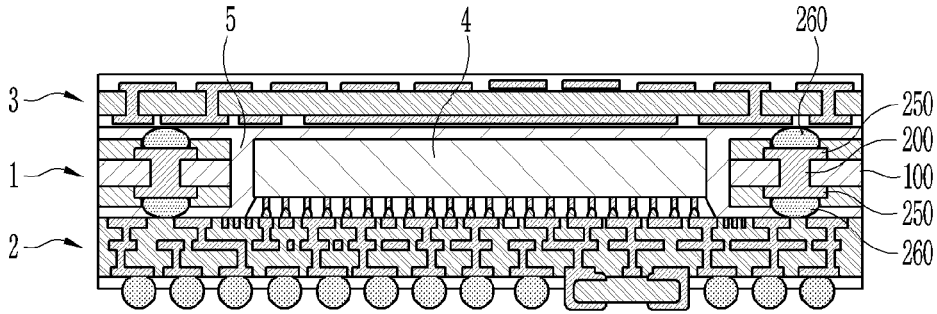
FIG. 6 is a drawing illustrating a semiconductor package including the connecting board according to the embodiment.

FIG. 6 is a drawing illustrating a semiconductor package which includes the connecting board according to the embodiment.

Referring to FIG. 6, the semiconductor package includes the connecting board 1, a lower circuit board 2, and an upper circuit board 3

The lower circuit board 2 and the upper circuit board 3 are stacked in the thickness direction Z. The connecting board 1 is disposed between the lower circuit board 2 and the upper circuit board 3.

The lower circuit board 2 is disposed in the lower portion of the semiconductor package. On the lower circuit board 2, at least one circuit layer may be formed. On the lower circuit board 2, an electronic element 4 is mounted. The electronic element 4 is disposed on the side facing the upper circuit board 3. The electronic element 4 may be at least one of active elements, passive elements, and integrated circuits. For example, the electronic element 4 may be an application processor (AP), an application-specific integrated circuit (ASIC) such as a graphics processing unit (GPU), etc. The electronic element 4 may be mounted on the lower circuit board 2 by a flip-chip bonding method or a wire bonding method using conductive members.

The lower portion of the connecting board 1 is coupled to the lower circuit board 2. The connecting board 1 may be bonded to the lower circuit board 2 by bonding members 260 attached to the connection pads 250. The bonding members 260 may be solder balls, etc.

At least a portion of the electronic element 4 in the thickness direction Z is disposed inside the cavity 105 in the connecting board 1. As an example, the thickness of the connecting board 1 may be set so as to correspond to the thickness of the electronic element 4 such that the electronic element 4 can be disposed inside the cavity 105.

The upper circuit board 3 is coupled to the upper portion of the connecting board 1. The upper circuit board 3 may include at least one circuit layer. The upper circuit board 3 may be bonded to the connecting board 1 by bonding members 260 attached to the connection pads 250 of the connecting board 1. The circuit layers of the upper circuit board 3 and the circuit layers of the lower circuit board 2 are coupled to one another through the vias 200 and the connection pads 250 of the connecting board 1.

The space between the lower circuit board 2 and the connecting board 1, the space between the connecting board 1 and the upper circuit board 3, and at least a region in the cavity 105 are filled with a sealing material 5. The sealing material 5 may be an insulating material. For example, the sealing material 5 may be a thermosetting resin such as an epoxy resin, a thermoplastic resin such as polyimide, etc. Alternatively, the sealing material 5 may be an insulating resin containing an inorganic filler. For example, the sealing material 5 may be Ajinomoto build-up film (ABF), FR-4, a bismaleimide triazine (BT) resin, etc.

In the semiconductor package according to the embodiment, the connecting board 1 is disposed between the lower circuit board 2 and the upper circuit board 3, and the cavity 105 for accommodating the electronic element 4 is formed in the connecting board 1. Accordingly, in the semiconductor package, a space for accommodating the electronic element 4 can be effectively formed.

Further, in the semiconductor package according to the embodiment, while a space for accommodating the electronic element 4 is sufficiently secured, the gap between the lower circuit board 2 and the connecting board 1 and the gap between the connecting board 1 and the upper circuit board 3 can be reduced. Accordingly, it is possible to reduce the size of the bonding members 260 for bonding the connecting board 1 to the lower circuit board 2 and the upper circuit board 3. Therefore, more vias 200 for coupling the lower circuit board 2 and the upper circuit board 3 can be formed in the connecting board 1.

Furthermore, the strength of the semiconductor package according to the embodiment can be improved by the reinforcing members 400 included in the connecting board 1.

Figure 7:
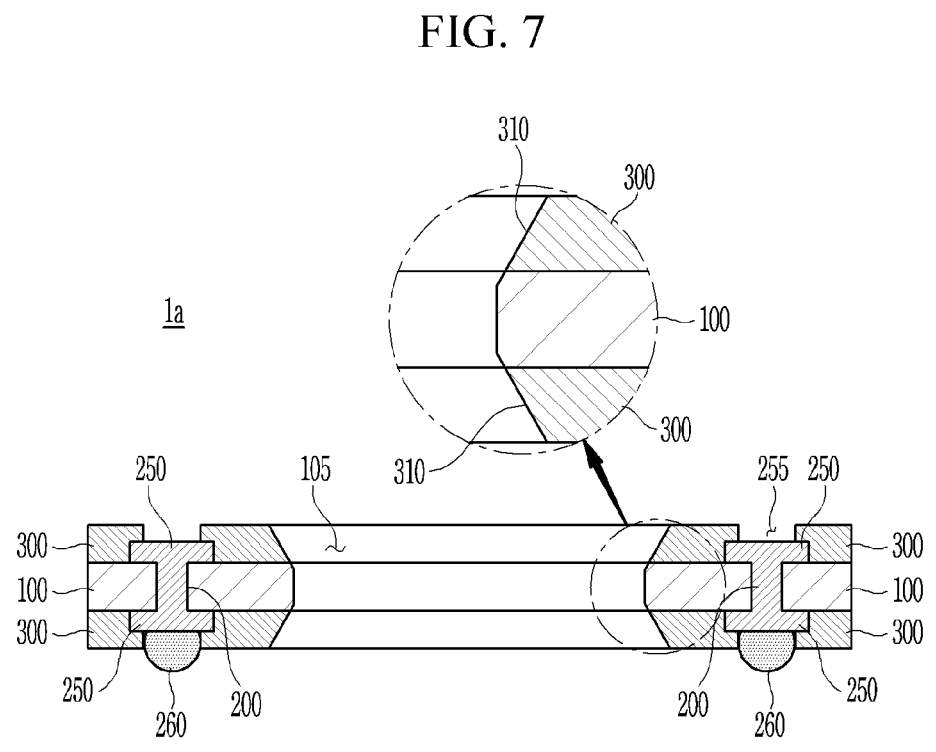

FIG. 7 is a vertical cross-sectional view of a connecting board according to another embodiment.

Referring to FIG. 7, a connecting board 1a according to another embodiment includes a core layer 100, vias 200, and connection pads 250.

The core layer 100 has a predetermined area and a predetermined thickness. The core layer 100 may be formed of an insulating material. In the inner center region of the core layer 100 based on a plane perpendicular to the thickness direction Z, a cavity 105 is formed. The cavity 105 is formed so as to pass through the connecting board in the thickness direction Z. The cavity 105 has a size corresponding to an electronic element 4 to be mounted.

The vias 200 are disposed so as to pass through the core layer 100. The vias 200 may be formed of a conductive material.

The connection pads 250 are coupled to the ends of the vias 200 located on both sides of the core layer 100 in the thickness direction. The connection pads 250 may be formed of a conductive material.

On the core layer 100, solder resist layers 300 may be formed. The solder resist layers 300 may be formed on both surfaces of the core layer 100 in the thickness direction Z. The solder resist layers 300 may be formed such that their inner regions 310 facing the cavity 105 get thinner as they go toward the cavity 105. For example, the inner regions of the solder resist layers 300 may be inclined toward the core layer 100 as they go toward the cavity 105. Also, the inner regions 310 of the solder resist layers 300 may be formed such that their cross sections along the thickness direction are rounded. Regions of the solder resist layers 300 facing each other with the cavity 105 interposed therebetween may be plane-symmetrical with respect to a plane along the thickness direction Z.

The other configuration of the connecting board 1a according to another embodiment is the same as that of the connecting board 1 described above with reference to FIG. 1 to FIG. 6, and thus a redundant description thereof will not be made.

Figure 8:
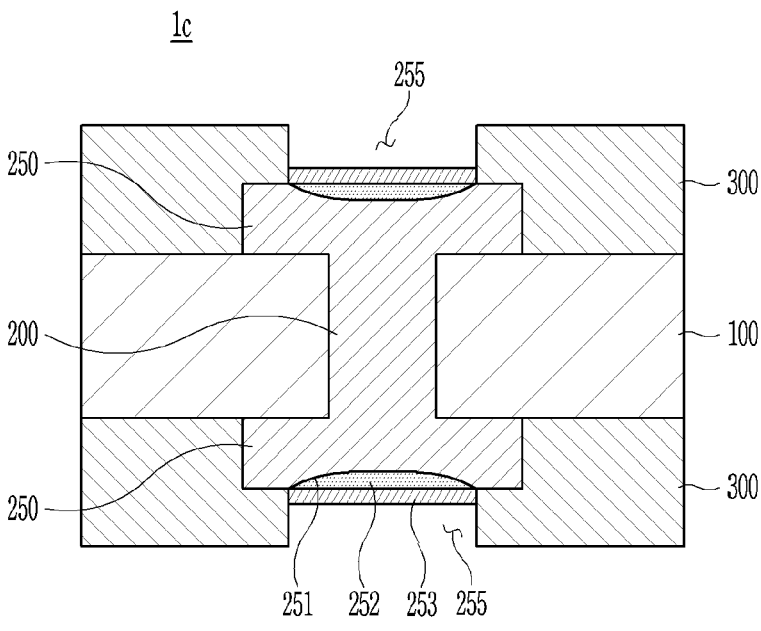
FIG. 8 is a vertical cross-sectional view of a region of a connecting board according to yet another embodiment where a via is located.

FIG. 8 is a vertical cross-sectional view of a region of a connecting board according to yet another embodiment, where a via is located, taken along the thickness direction.

Referring to FIG. 8, a connecting board 1c according to yet another embodiment includes a core layer 100, vias 200, and connection pads 250.

The core layer 100 has a predetermined area and a predetermined thickness. The core layer 100 may be formed of an insulating material.

The vias 200 are disposed so as to pass through the core layer 100. The vias 200 may be formed of a conductive material.

The connection pads 250 are coupled to the ends of the vias 200 located on both sides of the core layer 100 in the thickness direction. The connection pads 250 may be formed of a conductive material.

On the core layer 100, solder resist layers 300 may be formed. The solder resist layers 300 may be formed on both surfaces of the core layer 100 in the thickness direction Z. The solder resist layers 300 are not formed on at least some parts of regions aligned with the connection pads 250 in the thickness direction, such that openings 255 are formed so as to expose the connection pads 250 to the outside. The solder resist layers 300 may be formed so as to surround the perimeters of the connection pads 250.

In the outer surfaces of the connection pads 250 located on the opposite sides to the regions of the connection pads coupled to the vias 200, pad recesses 251 are formed to be concave toward the vias 200. The pad recesses 251 may be formed in regions aligned with the openings 255 in the thickness direction.

On the outer surfaces of the connection pads 250, coating layers 252 and 253 may be formed to cover the pad recesses

251. The coating layers 252 and 253 may include inner coating layers 252 and outer coating layers 253.

The inner coating layers 252 may be formed on the outer surfaces of the connection pads 250. The inner coating layers 252 may be formed so as to fill the pad recesses 251 and have flat outer surfaces facing the openings 255. The inner coating layers 252 are formed of a conductive material. The inner coating layers 252 may be formed of one or more of copper (Cu), silver (Ag), palladium (Pd), aluminum (Al), nickel (Ni), titanium (Ti), gold (Au), platinum (Pt), an alloy thereof, etc.

The outer coating layers 253 may be formed on the outer surfaces of the inner coating layers 252. The outer coating layers 253 may be formed so as to have flat outer surfaces facing the openings 255. The outer coating layers 253 may be formed of a conductive material. For example, the outer coating layers 253 may be formed of one or more of copper (Cu), silver (Ag), palladium (Pd), aluminum (Al), nickel (Ni), titanium (Ti), gold (Au), platinum (Pt), an alloy thereof, etc. The material of the outer coating layers 253 may be different from the material of the inner coating layers 252.

Alternatively, the coating layers 252 and 253 may be omitted, and the bonding members 260 may be attached directly to the connection pads 250 and be used.

In the connecting board 1c according to yet another embodiment, the coating layers 252 and 253 or the bonding members 260 can be effectively attached to the connection pads 250 due to the pad recesses 251.

The configuration described with reference to FIG. 8 may be applied to the embodiments shown in FIGS. 1-7.

FIG. 9 to FIG. 16 are drawings illustrating a connecting board manufacturing method according to an embodiment.

Hereinafter, with reference to FIG. 9 to FIG. 16, the connecting board manufacturing method according to the embodiment will be described.

Figure 9:
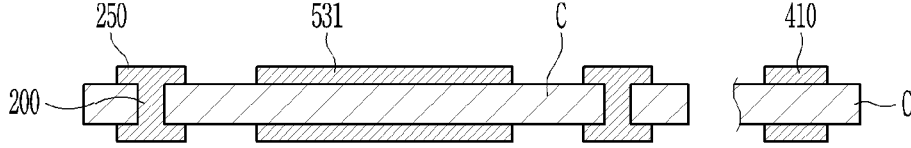
FIG. 9 to FIG. 16 are drawings illustrating a connecting board manufacturing method according to an embodiment.

Referring to FIG. 9, vias 200 are formed so as to pass through a core member C in the thickness direction Z, and connection pads 250 are formed on the ends of the vias 200 located on both sides of the core member in the thickness direction. The vias 200 may be formed by forming through-holes in the core member C by a laser, etc., and filling a conductive material in the through-holes. The core member C may be formed of an insulating material.

Further, on one surface or both surfaces of the core member C in the thickness direction Z, inner reinforcing members 410 may be formed. On the outer regions of the core member C based on a plane perpendicular to the thickness direction Z, the inner reinforcing members 410 may be formed. The inner reinforcing members 410 may be formed of a metal material such as copper, etc.

Furthermore, on one surface or both surfaces of the core member C in the thickness direction Z, inner dummy reinforcing members 531 may be formed. On the inner center region of the core member C based on a plane perpendicular to the thickness direction Z, the inner dummy reinforcing members 531 may be formed. The inner dummy reinforcing members 531 may be formed of a metal material such as copper, etc.

The inner reinforcing members 410 and the inner dummy reinforcing members 531 may be formed of the same material together.

Figure 10:
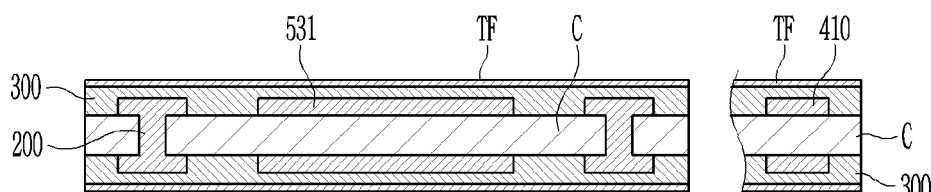

Referring to FIG. 10, on both surfaces of the core member C in the thickness direction Z, solder resist layers 300 and metal thin films TF are sequentially formed.

The solder resist layers 300 may be formed thicker than the thicknesses of the connection pads 250, the inner reinforcing members 410, the inner dummy reinforcing members 531. Accordingly, the connection pads 250, the inner reinforcing members 410, and the inner dummy reinforcing members 531 may be buried in the solder resist layers 300.

The metal thin films TF may be formed of a metal material such as copper, etc.

Figure 11:
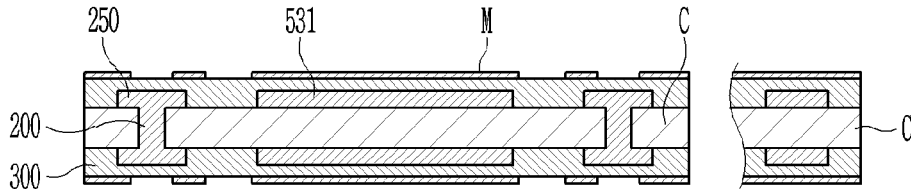

Referring to FIG. 11, masks M are formed using the metal thin films TF. Regions of the metal thin films TF aligned with the connection pads 250 in the thickness direction Z may be removed. Also, regions of the metal thin films TF having a ring shape as seen in a plan view perpendicular to the thickness direction Z may be removed such that the metal thin films are divided into the inner regions and the outer regions. The ring-shaped regions may be rectangular. The metal thin films TF may be removed by an etching process. Also, the metal thin films TF may be removed by a laser, etc.

Figure 12:
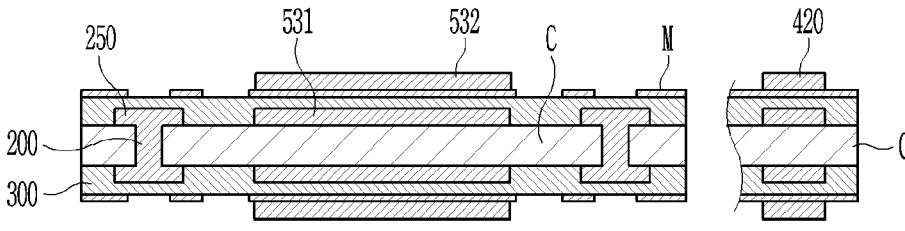

Referring to FIG. 12, on both surfaces or one surface of a mask M in the thickness direction Z, outer reinforcing members 420 are formed. Also, on both surfaces or one surface of a mask M in the thickness direction Z, outer dummy reinforcing members 532 may be formed. The outer reinforcing members 420 and the outer dummy reinforcing members 532 may be formed by a deposition process, etc. The outer reinforcing members 420 and the outer dummy reinforcing members 532 may be formed of a metal material such as copper, etc. The outer reinforcing members 420 and the outer dummy reinforcing members 532 may be formed of the same material as that of the metal mask (M) layers. The outer reinforcing members 420 and the outer dummy reinforcing members 532 may be formed together.

Figure 13:
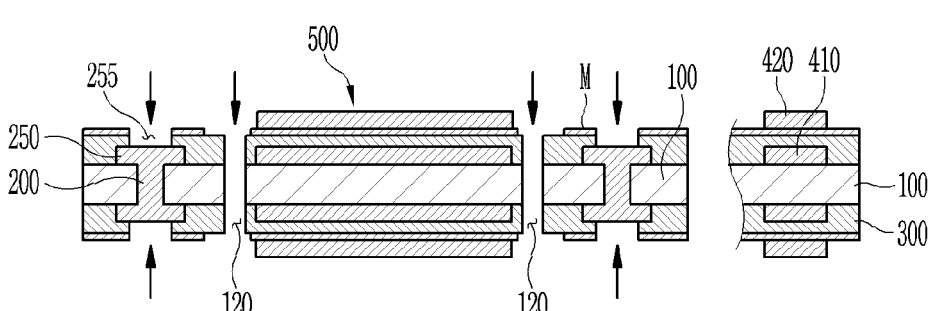

Referring to FIG. 13, openings 255 are formed so as to expose the connection pads 250 to the outside, and a partition space 120 is formed by discontinuously cutting so as to pass between the inner region and the outer region based on a plane perpendicular to the thickness direction Z. The openings 255 and the partition space 120 are formed in regions of the masks M from which the solder resist layers 300 are exposed. The openings 255 and the partition space 120 may be formed by a laser, etc. Accordingly, the outer region becomes a connecting board 1, and on the inner center region of the connecting board 1, reinforcement dummy 500 is located. Also, the inner regions of the solder resist layers 300 facing the cavity 105 may be inclined by processing using a laser.

Figure 14:
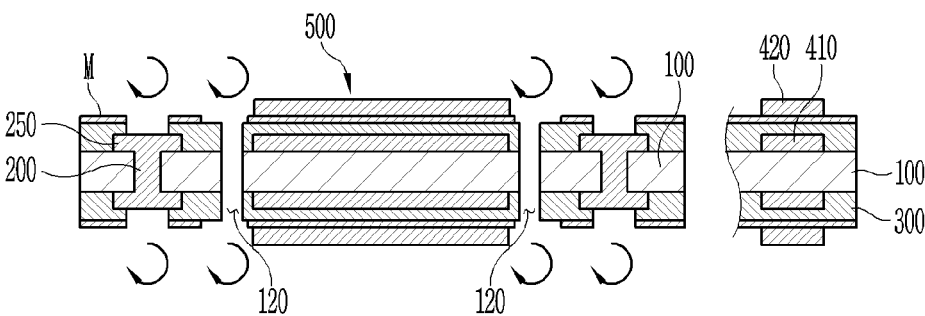

Referring to FIG. 14, a desmear process is performed. The desmear process may be performed in a dry process or a wet process.

Figure 15:
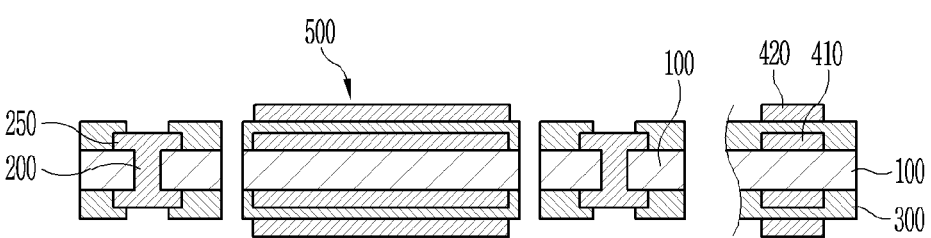

Referring to FIG. 15, the masks M are removed. The masks M may be removed by an etching process, etc. In addition, the connection pads 250 may also be etched together, such that pad recesses 251 are formed in the connection pads 250.

Figure 16:
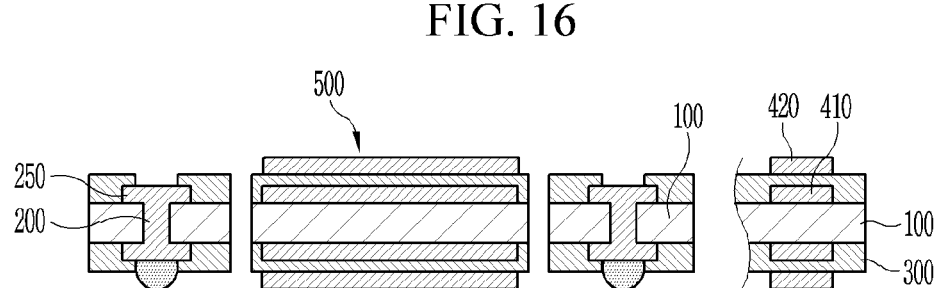

Referring to FIG. 16, to the connection pads 250, solder balls which are bonding members 260 may be attached. The solder balls may be attached to connection pads 250 located on one side in the thickness direction, among the connection pads 250 located on both sides in the thickness direction Z. Accordingly, both sides of the connecting board 1 in the thickness direction Z can be distinguished from each other, based on the side on which the solder balls are attached.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A connecting board comprising:
a core layer having a cavity in a thickness direction to pass through an inner center region of the core layer based on a plane perpendicular to the thickness direction;
a via passing through the core layer; and
connection pads that are coupled to both ends of the via,
wherein the core layer includes a plurality of coupling ribs which extend in a same direction from one of a plurality of edges of the connecting board toward another of the plurality of edges of the connecting board.

2. The connecting board of claim 1, further comprising:
a reinforcement dummy that is located in the cavity and is coupled to the plurality of coupling ribs.

3. The connecting board of claim 2, wherein the reinforcement dummy includes:
a dummy core layer that is coupled to the plurality of coupling ribs, and
inner dummy reinforcing members that are attached to at least one of both surfaces of the dummy core layer in the thickness direction.

4. The connecting board of claim 2, wherein the reinforcement dummy includes:
a dummy core layer that is coupled to the plurality of coupling ribs,
dummy-side solder resist layers that are disposed on both surfaces of the dummy core layer in the thickness direction, and
outer dummy reinforcing members that are attached to at least one of both surfaces of the dummy-side solder resist layers in the thickness direction.

5. The connecting board of claim 1, further comprising:
inner reinforcing members that are attached to at least one of both surfaces of the core layer in the thickness direction.

6. The connecting board of claim 5, wherein the connection pads and the inner reinforcing members include a same material and are spaced apart from each other.

7. The connecting board of claim 5, wherein the inner reinforcing members are spaced apart from the via.

8. The connecting board of claim 1, further comprising:
solder resist layers that are disposed on both surfaces of the core layer in the thickness direction; and
outer reinforcing members that are attached to at least one of both surfaces of the solder resist layers in the thickness direction.

9. The connecting board of claim 1, further comprising:
solder resist layers that are disposed on both surfaces of the core layer in the thickness direction such that inner regions of the solder resist layers facing the cavity get thinner in a direction toward the cavity.

10. The connecting board of claim 1, wherein
in outer surfaces of the connection pads located on an opposite side to regions coupled to the vias, the connection pads have pad recesses to be concave toward the vias.

11. The connecting board of claim 10, further comprising:
coating layers, disposed on the outer surfaces of the connection pads, covering the pad recesses.

12. The connecting board of claim 1, wherein the core layer includes a partition space extending between the plurality of coupling ribs.

13. A connecting board comprising:
a core layer having a cavity in a thickness direction to pass through an inner center region of the core layer based on a plane perpendicular to the thickness direction;
a via passing through the core layer;

connection pads that are coupled to both ends of the via; and reinforcing members, wherein in the plane perpendicular to the thickness direction, one or more of the reinforcing members are spaced apart from the cavity and the connection pads, and the one or more of the reinforcing members are provided on at least one of both surfaces of the core layer in the thickness direction, so as to be coupled to the core layer.

14. The connecting board of claim 13, wherein the reinforcing members include inner reinforcing members that are attached to at least one of both surfaces of the core layer in the thickness direction.

15. The connecting board of claim 13, further comprising:

solder resist layers disposed on both surfaces of the core layer in the thickness direction, wherein the reinforcing members include outer reinforcing members that are attached to at least one of both surfaces of the solder resist layers in the thickness direction.

16. A manufacturing method of a connecting board comprising:

forming a via in a core member so as to pass through the core member in a thickness direction, and forming connection pads on both ends of the via;

sequentially forming solder resist layers and metal thin films on both surfaces of the core member in the thickness direction;

forming masks using the metal thin films; and forming a partition space penetrating through the core member by discontinuously cutting so as to pass between an inner region and an outer region based on a plane perpendicular to the thickness direction, so as to define the outer region as the connecting board and the inner region as a reinforcement dummy, wherein after forming the partition space, the core member includes a plurality of coupling ribs which extend in a same direction from one of a plurality of edges of the core member toward another of the plurality of edges of the core member.

17. The manufacturing method of the connecting board according to claim 16, further comprising:

after forming the masks, forming outer reinforcing members on the masks before the connecting board and the reinforcement dummy are defined.

18. The manufacturing method of the connecting board according to claim 16, further comprising:

removing the reinforcement dummy.

* * * * *